United States Patent
Campanella Pineda et al.

(10) Patent No.: US 10,833,650 B1
(45) Date of Patent: Nov. 10, 2020

(54) RECONFIGURABLE MEMS DEVICES, METHODS OF FORMING RECONFIGURABLE MEMS DEVICES, AND METHODS FOR RECONFIGURING FREQUENCIES OF A MEMS DEVICE

(71) Applicant: GLOBALFOUNDRIES Singapore Pte. Ltd., Singapore (SG)

(72) Inventors: Humberto Campanella Pineda, Cork (IE); Joan Josep Giner De Haro, Singapore (SG); You Qian, Singapore (SG); Rakesh Kumar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 28 days.

(21) Appl. No.: 16/437,011

(22) Filed: Jun. 11, 2019

(51) Int. Cl.
  *H03H 9/24* (2006.01)
  *H03H 9/02* (2006.01)
  *H03H 3/007* (2006.01)

(52) U.S. Cl.
  CPC ........ *H03H 9/2426* (2013.01); *H03H 3/0073* (2013.01); *H03H 9/02275* (2013.01)

(58) Field of Classification Search
  CPC .............. H03H 9/2426; H03H 3/0073; H03H 9/02275; H03H 9/2431; H03H 9/2436; H03H 9/2447; H03H 9/24; H03H 2009/241; H03H 2009/2415; H03H 2009/2421; H03H 2009/2442
  See application file for complete search history.

(56) References Cited

U.S. PATENT DOCUMENTS

| | | | | |
|---|---|---|---|---|
| 5,521,453 A | * | 5/1996 | Yatsuda | H03H 9/1455 310/313 R |
| 6,377,138 B1 | * | 4/2002 | Takagi | H03H 3/08 310/313 B |

(Continued)

OTHER PUBLICATIONS

Hummel et al. "Highly reconfigurable Aluminum Nitride MEMS resonator using 12 monolithically integrated phase change material switches", IEEE Conference Paper, ISBN (Electronic): 978-1-4799-8955-3, ISSN (Electronic): 2164-1641, Publication Date: Jun. 1, 2015, Electronic Publication Date: Aug. 5, 2015. (Year: 2015).*

*Primary Examiner* — Emily P Pham
(74) *Attorney, Agent, or Firm* — Viering Jentschura & Partner MBB

(57) ABSTRACT

A MEMS device including an active layer having a first surface and a second surface is provided. A first electrode and a second electrode, and at least one reconfigurable electrode segment are arranged over the first surface of the active layer. At least one reconfiguration layer is arranged over the second surface of the active layer. The at least one reconfigurable electrode segment and the at least one reconfiguration layer overlaps. One or more via contacts are disposed through the active layer configured to couple the at least one reconfigurable electrode segment and the at least one reconfiguration layer. The at least one reconfiguration layer is coupled to a reconfiguration switch for reconfiguring electrical connections to the at least one reconfigurable electrode segment. The MEMS device is configured to generate different resonant frequencies by reconfiguring the electrical connections to the at least one reconfigurable electrode segment using the reconfiguration switch.

20 Claims, 10 Drawing Sheets

(56) References Cited

U.S. PATENT DOCUMENTS

| | | | |
|---|---|---|---|
| 6,522,047 B1 | 2/2003 | Toda | |
| 6,771,144 B2* | 8/2004 | Takamine | H03H 9/6436 |
| | | | 333/133 |
| 7,348,867 B2* | 3/2008 | Hattori | H03H 9/542 |
| | | | 333/186 |
| 8,143,681 B2* | 3/2012 | Zaghloul | G01N 29/022 |
| | | | 257/416 |
| 10,601,400 B1* | 3/2020 | McConney | H03H 9/22 |
| 2005/0174014 A1* | 8/2005 | Korden | H03H 9/25 |
| | | | 310/322 |
| 2011/0012696 A1 | 1/2011 | Skarp | |
| 2017/0187347 A1 | 6/2017 | Rinaldi et al. | |

* cited by examiner

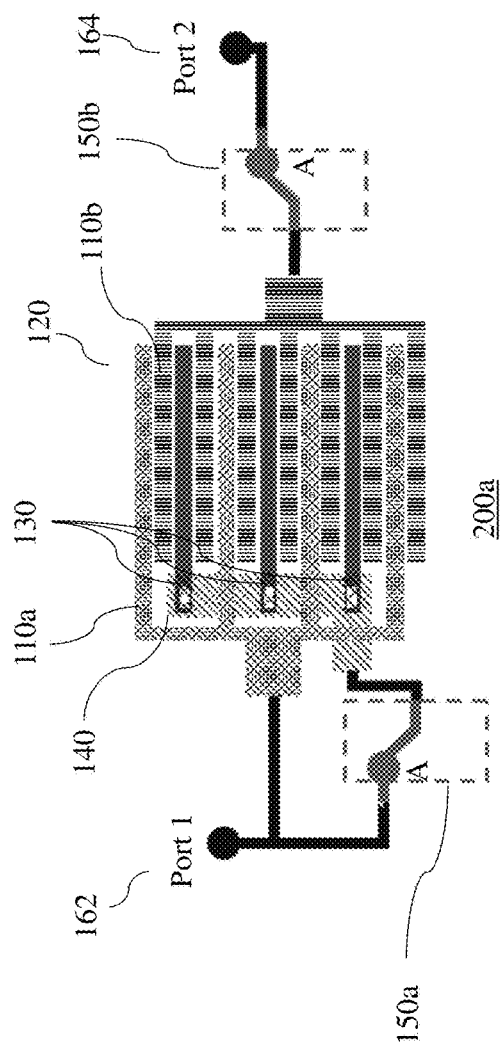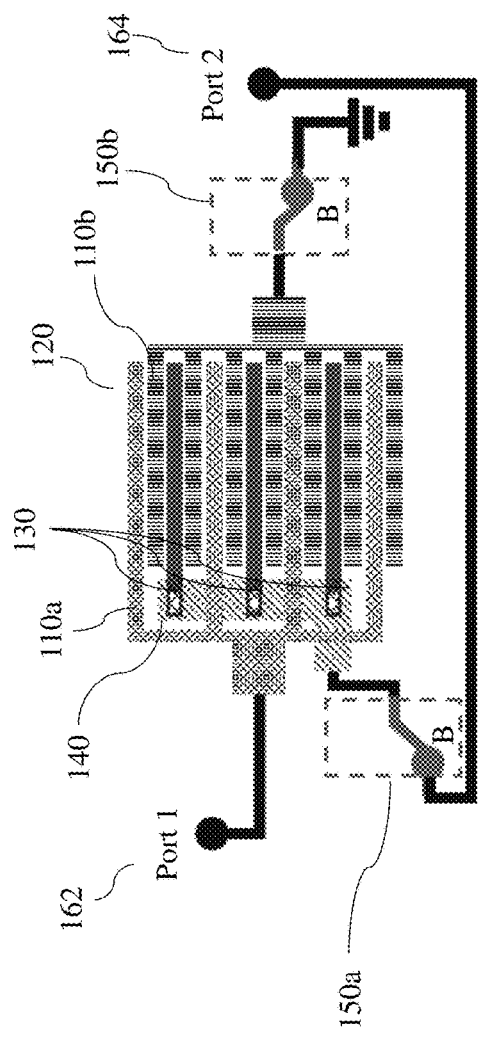
FIG. 2A
FIG. 2B

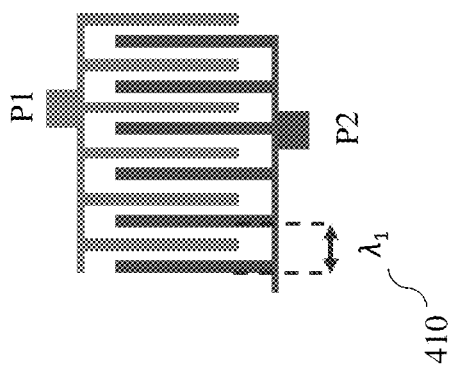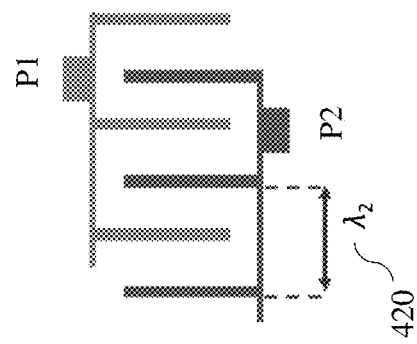

RECONFIGURABLE MEMS DEVICES, METHODS OF FORMING RECONFIGURABLE MEMS DEVICES, AND METHODS FOR RECONFIGURING FREQUENCIES OF A MEMS DEVICE

TECHNICAL FIELD

The present disclosure relates generally to microelectromechanical systems (MEMS) devices, and more particularly to reconfigurable MEMS devices integrated with reconfiguration switches.

BACKGROUND

Acoustic devices, such as ultrasonic transducer devices, are generally non-programmable. For example, an acoustic device is hardwired after fabrication and its operating frequency cannot be changed once it is fabricated. For example, 'hard' acoustic and/or electric connections define the function of the acoustic device. There is generally no practical method for tuning the frequency of the acoustic device after fabrication thereof. Accordingly, multiple devices are required in order to perform multiple functions requiring different operating frequencies. This results in an increased number of acoustic chips employed in front end modules, leading to larger modules. For example, multiple acoustic devices are employed to deliver multiple functions, such as filters, one-port transducers, two-port transducers, gratings, reflectors, etc. The increased number of acoustic devices results in a larger footprint. For example, for multiple frequency filters, multiple acoustic device circuits are needed (e.g., system-in-package (SiP)) which are packaged in radio frequency (RF) front end modules.

From the foregoing discussion, it is desirable to provide reconfigurable MEMS devices.

SUMMARY

Embodiments generally relate to MEMS devices and method for forming the MEMS devices. According to various embodiments, a MEMS device including an active layer having a first surface and a second surface is provided. A first electrode and a second electrode is arranged over the first surface of the active layer. At least one reconfigurable electrode segment is arranged over the first surface of the active layer. The at least one reconfigurable electrode segment is arranged between the first electrode and the second electrode. At least one reconfiguration layer is arranged over the second surface of the active layer. The at least one reconfigurable electrode segment and the at least one reconfiguration layer overlaps. One or more via contacts are disposed through the active layer from the first surface to the second surface. The one or more via contacts are configured to couple the at least one reconfigurable electrode segment and the at least one reconfiguration layer. The at least one reconfiguration layer is coupled to a reconfiguration switch for reconfiguring electrical connections to the at least one reconfigurable electrode segment. The MEMS device is configured to generate different resonant frequencies by reconfiguring the electrical connections to the at least one reconfigurable electrode segment using the reconfiguration switch.

According to various embodiments, a method for forming a MEMS device is provided. The method includes providing an active layer having a first surface and a second surface. A first electrode and a second electrode is arranged over the first surface of the active layer. At least one reconfigurable electrode segment is arranged over the first surface of the active layer. The at least one reconfigurable electrode segment is arranged between the first electrode and the second electrode. At least one reconfiguration layer is arranged over the second surface of the active layer. The at least one reconfigurable electrode segment and the at least one reconfiguration layer overlaps. One or more via contacts is arranged through the active layer from the first surface to the second surface. The one or more via contacts are configured to couple the at least one reconfigurable electrode segment and the at least one reconfiguration layer. The at least one reconfiguration layer is coupled to a reconfiguration switch for reconfiguring electrical connections to the at least one reconfigurable electrode segment. The MEMS device is configured to generate different resonant frequencies by reconfiguring the electrical connections to the at least one reconfigurable electrode segment using the reconfiguration switch.

According to various embodiments, a method for reconfiguring a resonant frequency of a MEMS device is provided. The method includes providing a MEMS device, applying an electrical signal to a reconfiguration switch to change an operation of the reconfiguration switch from a first configuration state to a second configuration state for reconfiguring an electrical connection to at least one reconfigurable electrode segment, and applying the electrical signal to the first reconfigurable electrode segment by the reconfiguration switch. The MEMS device generates a different resonant frequency in the second configuration state from the first configuration state.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 2A-2B illustrate simplified tops views of an embodiment of a MEMS device in a first operation mode and a second operation mode of a reconfiguration switch, respectively;

FIGS. 4A-4B illustrate another embodiment a first effective separation distance and a second effective separation distance in the first operation mode and the second operation mode, respectively;

DETAILED DESCRIPTION

Figure 1A:
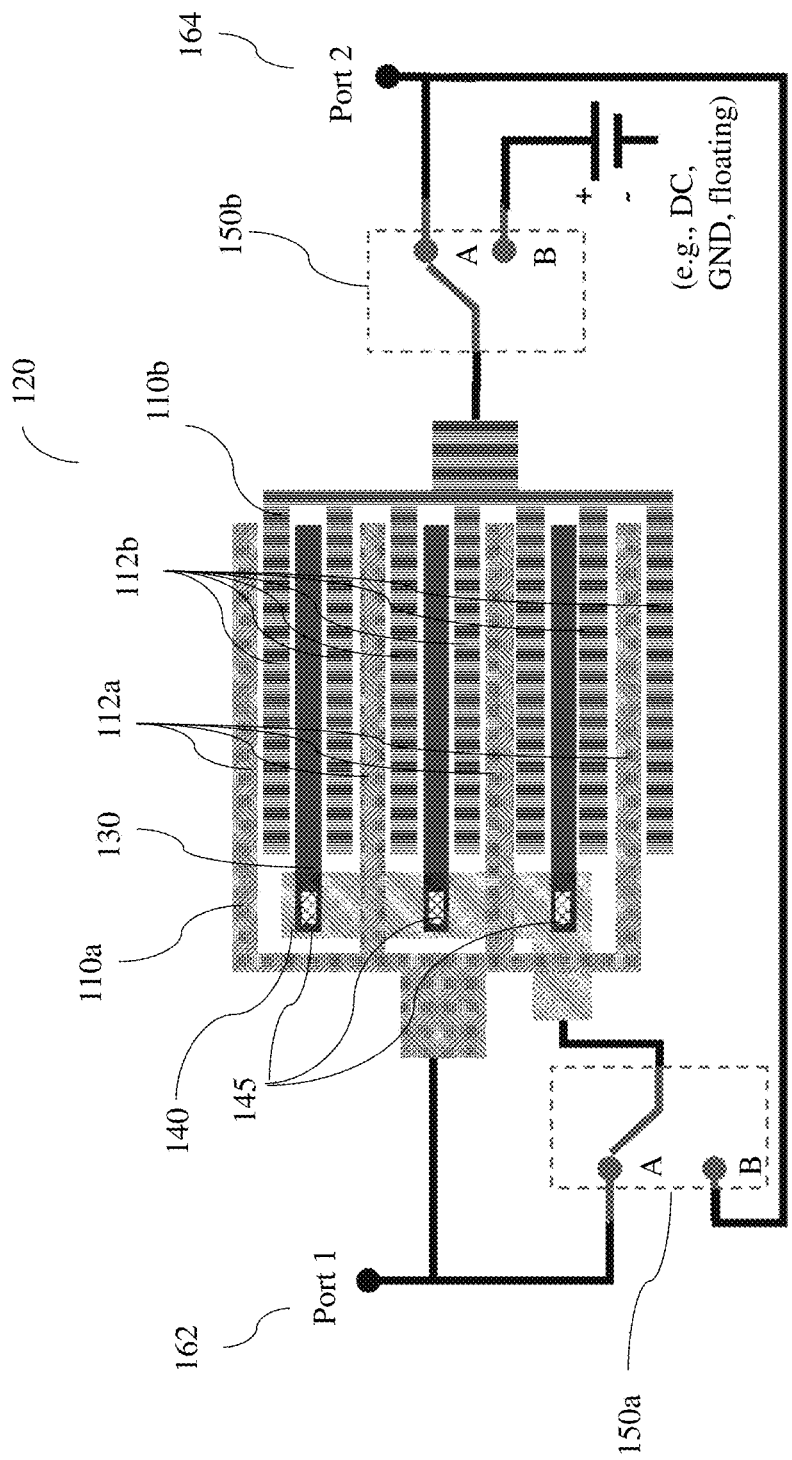
FIGS. 1A-1C show simplified top views of embodiments of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic, or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to MEMS devices. More particularly, embodiments relate to MEMS devices, which may be reconfigurable. The MEMS devices may be, or may include, acoustic resonator devices. In various non-limiting embodiments, a MEMS device includes an active layer having a first surface and a second surface. For example, the active layer may be an acoustic layer for transducing electrical signals into mechanical (or acoustic) waves. The active layer may be, or may include, a piezoelectric layer. The first surface and the second surface may be opposing surfaces. A first electrode and/or a second electrode may be arranged over the first surface of the active layer. According to various non-limiting embodiments, the first electrode and the second electrode may each include a plurality of interconnected electrode fingers. The plurality of interconnected electrode fingers of the first electrode and the second electrode may be arranged to form a pair of interdigitated electrodes of a resonator. At least one reconfigurable electrode segment may be arranged over the first surface of the active layer. The reconfigurable electrode segment(s) may be arranged between the first electrode and the second electrode. In various non-limiting embodiments, the reconfigurable electrode segment(s) may be arranged between two electrode fingers of the first electrode and/or the second electrode.

At least one reconfiguration layer may be arranged over the second surface of the active layer. The reconfigurable electrode segment(s) and the at least one reconfiguration layer may overlap. In some embodiments, a plurality of reconfigurable electrode segments may overlap one reconfiguration layer. In other embodiments, a plurality of first reconfigurable electrode segments may overlap a first reconfiguration layer and a plurality of second reconfigurable electrode segments may overlap a second reconfiguration layer. One or more via contacts may be disposed through the active layer from the first surface to the second surface. The via contact(s) may be configured to couple the reconfigurable electrode segment(s) and the reconfiguration layer(s). A reconfiguration layer may be coupled to a reconfiguration switch for reconfiguring electrical connections to the reconfigurable electrode segment(s). In various non-limiting embodiments, the operation of the MEMS device may be reconfigurable using the reconfiguration switch. For example, the reconfigurable electrode segment(s) may be selectively operable based on the different configuration states (or operation modes) of the reconfiguration switch. The MEMS device may be configured to generate or excite different resonant frequencies by reconfiguring the electrical connections to the reconfigurable electrode segment(s) using the reconfiguration switch. By changing or reconfiguring the electrical connections to the reconfigurable electrode segment(s) in the different configuration states of the reconfiguration switch, an electrode pitch or effective separation distance of the electrode fingers of the first electrode and/or the second electrode may be changed accordingly to excite different frequencies. A number of resonant frequencies of the MEMS device may be excited in accordance with the number of configuration states of the reconfiguration switch and the number of reconfigurable electrode segments. In a non-limiting embodiment, the reconfiguration switch may include a single-pole two-throw switch (or single-pole double-throw switch) having two configuration states. For example, one single-pole two-throw switch connected to one reconfigurable electrode segment may excite up to two different resonant frequencies of the MEMS device. In other words, the MEMS device may be operable to excite two different frequencies using a first configuration state or a second configuration state of the switch.

In a non-limiting embodiment, the operation of a plurality of reconfigurable electrode segments may be controlled using a single reconfiguration switch. For example, a reconfiguration layer may be coupled to a single switch. The reconfiguration switch may be an electrical switch. In a non-limiting example, the reconfiguration switch may be a radio frequency silicon-on-insulator (RFSOI) switch. The reconfiguration switch may be formed by CMOS processing, in a non-limiting example. The MEMS device may be operable at multiple frequencies depending on the number of configuration states of the reconfiguration switch.

The MEMS devices may be incorporated into or used with various types of RF devices such as reflectors, gratings, resonators, and filters, in various non-limiting examples. The MEMS device may advantageously reduce footprint for multi-frequency applications. Further, the MEMS devices may be designed and fabricated for arbitrary coupling of operating frequencies.

Figure 1B:
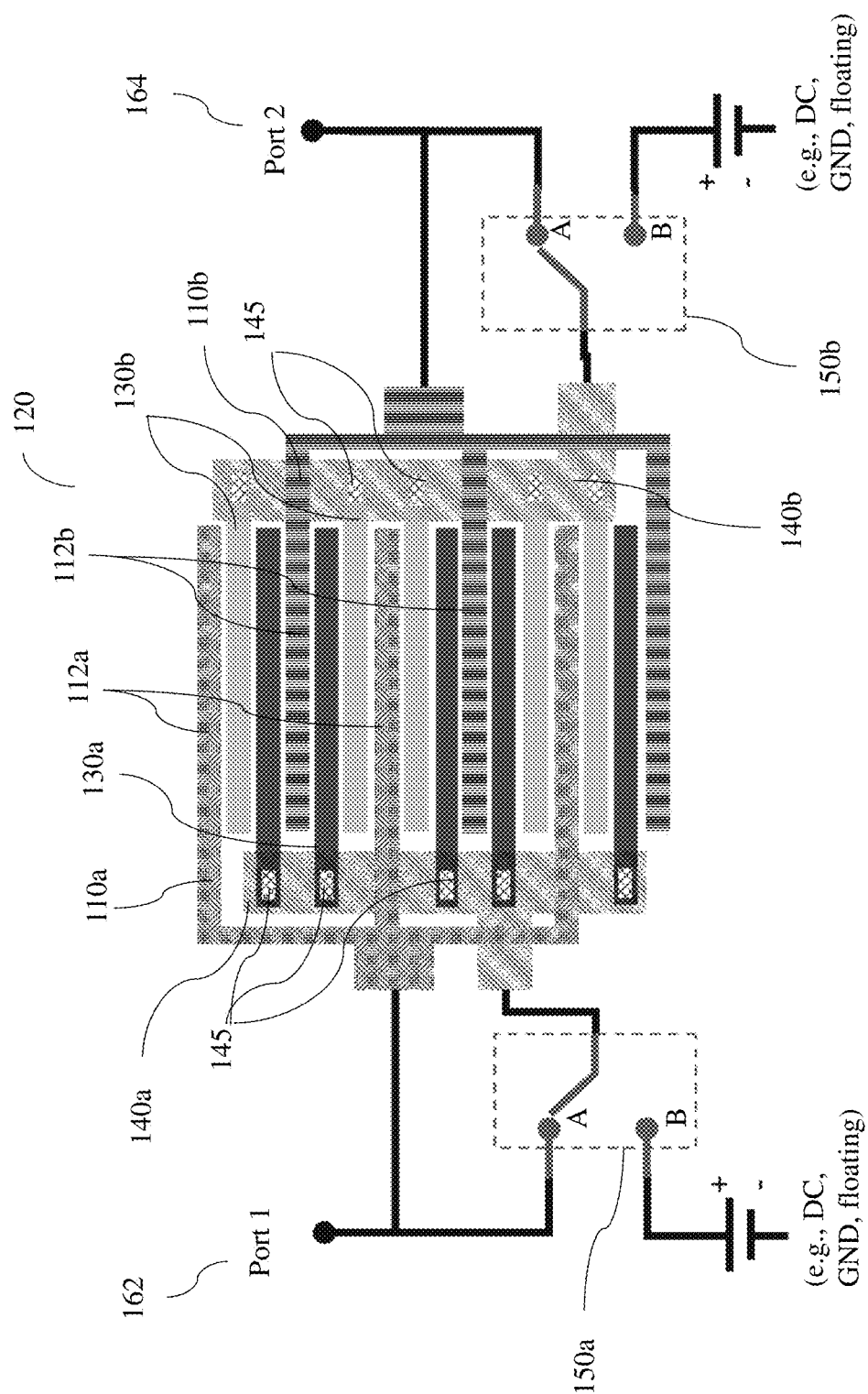
Figure 1C:
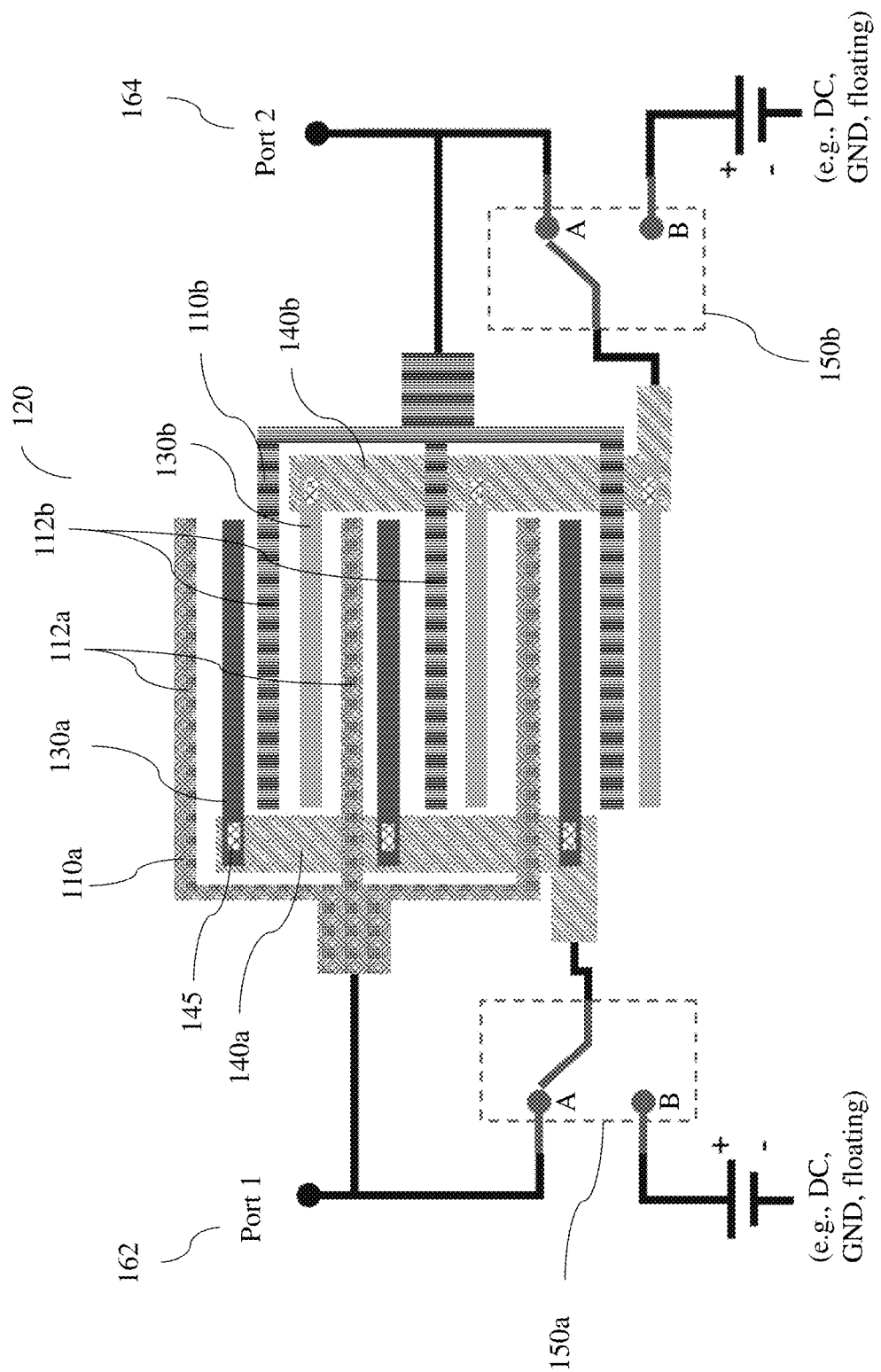

FIGS. 1A-1C show simplified top views of embodiments of a device 100. In various non-limiting embodiments, the device 100 may be, or include, a MEMS device. For example, the device 100 may be a MEMS resonator for generating acoustic waves. The acoustic waves may be in the ultrasonic range, in a non-limiting example. Other types of devices may also be useful. The MEMS device may include an active layer (not shown in FIGS. 1A-1C). The active layer may include a first surface and a second surface. The first surface and the second surface may be opposing surfaces. For example, the first surface may be a top surface while the second surface may be a bottom surface of the active layer. Alternatively, the first surface may be a bottom surface, while the second surface may be a top surface of the active layer. The active layer may be an acoustic layer for transducing electrical signals into mechanical or acoustic waves. In various non-limiting embodiments, the active layer may be, or may include, one or more piezoelectric layers. In a non-limiting example, the active layer may include or may be formed from aluminum nitride (AlN), scandium-doped AlN (SLAIN), lithium niobate (LiNbO$_3$), lithium tantalate (LiTa$_2$O$_3$), zinc oxide (ZnO), lead zirconate titanate (PZT), polyvinylidene fluoride (PVDF), any other thin-film piezoelectric material, or combinations thereof. Other types of acoustic and non-acoustic materials may also be useful.

In various non-limiting embodiments, the MEMS device may include electrodes 110 arranged over the active layer, forming a resonator or resonant region 120 of the MEMS device. In some embodiments, the device 100 may include multiple resonant regions in a reconfigurable acoustic device. In a non-limiting embodiment, a resonant region 120 may include a first electrode 110a and/or a second electrode 110b arranged over the first surface of the active layer. The first electrode 110a and the second electrode 110b may each include a plurality of interconnected electrode fingers 112. For example, the first electrode 110a may include interconnected first electrode fingers 112a, while the second electrode 110b may include interconnected second electrode fingers 112b. At least one reconfigurable electrode segment 130 may be arranged over the first surface of the active layer. According to various non-limiting embodiments, the reconfigurable electrode segment(s) 130 may be arranged between the first electrode 110a and the second electrode 110b. The reconfigurable electrode segment(s) 130, for example, is not physically connected to the first electrode 110a and/or the second electrode 110b. For example, a reconfigurable electrode segment may be physically isolated from the first electrode 110a and/or the second electrode 110b.

As illustrated in FIGS. 1A-1C, the reconfigurable electrode segment(s) 130 may be arranged between electrode fingers 112 of the first electrode 110a and/or the second electrode 110b. For example, a reconfigurable electrode segment 130 may be arranged between the first electrode fingers 112a, the second electrode fingers 112b, a first electrode finger 112a and a second electrode finger 112b, or combinations thereof. In some embodiments, there may be a plurality of reconfigurable electrode segments 130, as illustrated in FIG. 1A. In some cases, the plurality of reconfigurable electrode segments 130 may include one or more reconfigurable electrode segments not arranged between two electrode fingers 112. In other non-limiting embodiments, the reconfigurable electrode segment 130 may be a single electrode segment. The first electrode 110a, the second electrode 110b and the reconfigurable electrode segment(s) 130 may be substantially co-planar over the first surface of the active layer. The MEMS device may be a lateral resonator, in a non-limiting embodiment. The first electrode 110a, the second electrode 110b and the reconfigurable electrode segment(s) 130 may be formed by depositing an electrode material such as a metal layer over the first surface of the active layer and patterning the metal layer to form the first electrode 110a, the second electrode 110b and the reconfigurable electrode segment(s) 130. In various non-limiting embodiments, the first electrode 110a, the second electrode 110b and the reconfigurable electrode segment(s) 130 may be patterned to have an initial or predefined separation distance. For example, each reconfigurable electrode segment 130 may be separated from an adjacent electrode finger 112 by a predefined separation distance. In various non-limiting embodiments, the first electrode 110a, the second electrode 110b and the reconfigurable electrode segment(s) 130 may be, or operate as, interdigitated electrodes. For example, the first electrode 110a and the second electrode 110b may form a pair of interdigitated electrodes with reconfigurable electrode segment(s) 130 serving as reconfigurable electrode fingers of the first electrode 110a and/or the second electrode 110b, as will be described. The first electrode 110a, the second electrode 110b and the reconfigurable electrode segment(s) 130 may be formed from a conductive material such as, inter alia, molybdenum (Mo), tungsten (W), aluminum (Al), platinum (Pt), other suitable metals, or combinations thereof.

In various non-limiting embodiments, at least one reconfiguration layer 140 may be arranged over the second surface of the active layer. The reconfiguration layer(s) 140 may overlap at least a portion of a resonant region 120 of the MEMS device. The reconfiguration layer(s) 140 may be formed from a conductive material such as, inter alia, molybdenum (Mo), tungsten (W), aluminum (Al), platinum (Pt), other suitable metals, or combinations thereof. According to various non-limiting embodiments, at least one reconfigurable electrode segment 130 and at least one reconfiguration layer 140 may overlap. As illustrated in FIG. 1A, a plurality of reconfigurable electrode segments 130 overlap a reconfiguration layer 140. Said differently, the reconfiguration layer 140 may overlap a plurality of reconfigurable electrode segments 130.

One or more via contacts 145 may be disposed through the active layer from the first surface to the second surface of the active layer. In a non-limiting embodiment, the via contact(s) 145 extend through a depth of the active layer. For example, the via contact(s) 135 extend through a depth of the piezoelectric layer to contact the reconfigurable electrode segment(s) 130 and the reconfiguration layer 140 arranged on opposing surfaces of the piezoelectric layer. In the case the active layer is formed of one or more piezoelectric layers, the via contact(s) extend through at least a portion of one or more piezoelectric layers. In various non-limiting embodiments, the via contact(s) 145 may be configured to couple the reconfigurable electrode segment(s) 130 and the reconfiguration layer 140. In some embodiments, each via contact 145 may respectively couple each of a plurality of reconfigurable electrode segments 130 to the reconfiguration layer 140. The via contact(s) 145 may be formed of conductive material such as aluminum (Al), copper (Cu), or a combination thereof, in a non-limiting example. Other types of conductive material having low resistivity may also be used.

In various non-limiting embodiments, the reconfiguration layer 140 is coupled to a reconfiguration switch 150a, as illustrated in FIG. 1A. The reconfiguration layer 140 and the via contact(s) 145 electrically connect the reconfigurable electrode segment(s) 130 to the reconfiguration switch 150a. The reconfiguration layer 140 may be coupled to the reconfiguration switch 150a for reconfiguring electrical connections to the reconfigurable electrode segment(s) 130.

The electrical connections of the reconfigurable electrode segment(s) 130 may be reconfigured by the reconfiguration switch 150a, which further reconfigures an electrode pitch of the resonator region 120 (or effective separation distance of the electrode fingers 112 of the first electrode 110a and/or the second electrode 110b). In other words, the electrode pitch of the resonator region 120 may be reconfigurable by the reconfiguration switch 150a in different configuration states of the reconfiguration switch 150a. In various non-limiting embodiments, the MEMS device may be configured to generate or excite different resonant frequencies by reconfiguring the electrical connections to the reconfigurable electrode segment(s) using the reconfiguration switch 150a.

The first electrode 110a, the second electrode 110b and the reconfigurable electrode segment(s) 130 may be configured to produce a first electrode pitch in a first configuration state of the reconfiguration switch 150a to generate a first resonant frequency, and the first electrode 110a, the second electrode 110b and the reconfigurable electrode segment(s) 130 may be configured to produce a second electrode pitch different from the first electrode pitch in a second configuration state of the reconfiguration switch 150a to generate a second resonant frequency different from the first resonant frequency. Accordingly, the MEMS device may be reconfigured to operate at different frequencies based on the different configuration states of the reconfiguration switch 150a. In a non-limiting embodiment, the MEMS device may be operable with any combination of two frequencies based on the first configuration state and the second configuration state of the reconfiguration switch 150a.

In various non-limiting embodiments, the MEMS device may be coupled to, or may include, a first electrical port 162 and a second electrical port 164 for providing electrical signals. In various non-limiting embodiment, the first electrical port 162 and the second electrical port 164 may be configured to provide radio frequency (RF) signals. For example, the first electrical port 162 may be an input port while the second electrical port 164 may be an output port. Other configurations of the electrical ports may also be useful.

According to various non-limiting embodiments, the first electrode 110a may be coupled to the first electrical port 162. The first electrode 110a may be coupled to the first electrical port 162 by a conductive path. For example, the first electrode 110a may be coupled to the first electrical port 162 without using (or being coupled to) the reconfiguration switch 150a. The reconfigurable electrode segment(s) 130 may be further coupled to the first electrical port 162 by the reconfiguration switch 150a in a first configuration state, where the first electrode 110a, the second electrode 110b and the reconfigurable electrode segment(s) 130 are configured to produce a first electrode pitch in the first configuration state. The reconfigurable electrode segment(s) 130 may be further coupled to an electrical terminal different from the first electrical port 162 by the reconfiguration switch 150a in a second reconfiguration state, where the first electrode 110a, the second electrode 110b and the reconfigurable electrode segment(s) 130 are configured to produce a second electrode pitch in the second reconfiguration state. The second electrode pitch may be greater than the first electrode pitch.

According to various non-limiting embodiments, the reconfiguration switch 150a may be a first reconfiguration switch, and the MEMS device may further include a second reconfiguration switch 150b. Referring to FIG. 1A, the second electrode 110b may be coupled to the second reconfiguration switch 150b, in a non-limiting embodiment.

For example, the second electrode 110b may be coupled to the reconfiguration switch 150b without a reconfiguration layer and/or via contacts in the active layer. The second electrode 110b may be coupled to the second electrical port 164 or to direct current/ground/floating connections using the second reconfiguration switch 150b depending on the configuration state of the second reconfiguration switch 150b. In other words, the second reconfiguration switch 150b may reconfigure electrical connections to the second electrode 110b by changing the configuration state of the second reconfiguration switch 150b (e.g., between first operation mode A and second operation mode B using a single-pole two-throw switch). According to various non-limiting embodiments, the second electrode 110b may be coupled to the second electrical port 164 by the second reconfiguration switch 150b in a first reconfiguration state (e.g., first operation mode or state A), and the second electrode 110b may be coupled to an electrical terminal different from the second electrical port 164 by the second reconfiguration switch 150b in a second reconfiguration state (e.g., second operation mode or state B) while the reconfigurable electrode segment(s) 130 may be further coupled to the second electrical port 164 by the first reconfiguration switch 150a in the second reconfiguration state.

Each reconfigurable electrode segment 130 may be arranged in alternating sequence with first electrode fingers 112a of the first electrode 110a. As illustrated in FIG. 1A, each reconfigurable electrode segment 130 may be arranged in between two first electrode fingers 112a of the first electrode 110a. For example, the reconfigurable electrode segments 130 may serve to increase an electrode pitch of the first electrode 110a in one of the configuration states of the reconfiguration switch 150a, and to decrease an electrode pitch of the first electrode 110a in another configuration state of the reconfiguration switch 150a.

FIGS. 2A-2B illustrate simplified tops views of an embodiment of the MEMS device in a first operation mode 200a and a second operation mode 200b of the first reconfiguration switch 150a and the second reconfiguration switch 150b, respectively. The MEMS device may be similar to that described in FIG. 1A. For example, the MEMS device may include the first electrode 110a coupled to the first electrical port 162, the second electrode 110b coupled to the second reconfiguration switch 150b, and the reconfigurable electrode segment(s) 130 coupled to the first reconfiguration switch 150a by the reconfiguration layer 140.

Figure 3A:
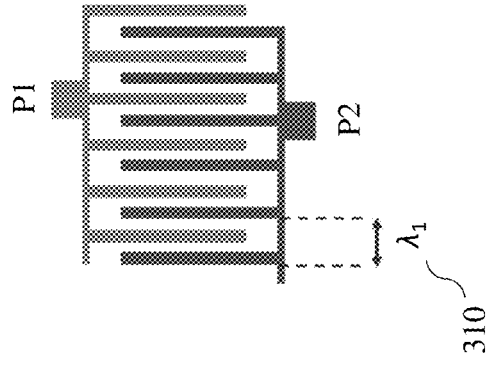
FIGS. 3A-3B illustrate an embodiment of a first effective separation distance and a second effective separation distance in the first operation mode and the second operation mode, respectively.

Referring to FIG. 2A, the MEMS device may be operable in the first configuration state (e.g., first operation mode or state A) of the first reconfiguration switch 150a and the second reconfiguration switch 150b. In the first configuration state, the reconfigurable electrode segment(s) 130 may be coupled to the first electrical port 162 by the first reconfiguration switch 150a, while the second electrode 110b may be coupled to the second electrical port 164 by the second reconfiguration switch 150b. For example, the reconfigurable electrode segment(s) 130 and the first electrode 110a may be coupled to the first electrical port 162 to which a voltage denoted as P1 may be applied, while the second electrode 110b may be coupled to the second electrical port 164 to which a voltage denoted as P2 may be applied such that the first electrode 110a, the second electrode 110b and the reconfigurable electrode segment(s) 130 are configured to produce a first electrode pitch 310 or effective separation distance (denoted as $\lambda_1$) of the first electrode 110a in the first operation mode, as illustrated in FIG. 3A. Accordingly, the first electrode 110a may be operable to have the first effective separation distance in the first operation mode of the reconfiguration switch.

Figure 3B:
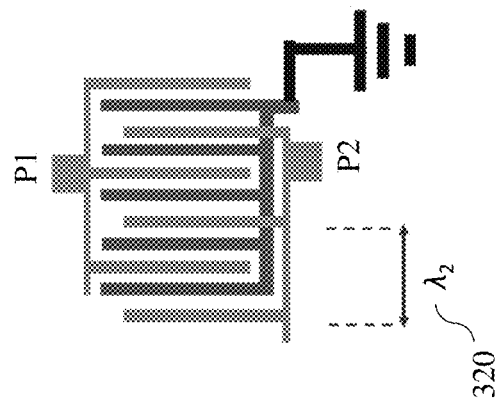

Referring to FIG. 2B, the MEMS device may be operable in the second configuration state (e.g., second operation mode or state B) of the first reconfiguration switch 150a and the second reconfiguration switch 150b. In the second configuration state, the reconfigurable electrode segment(s) 130 may be coupled to the second electrical port 164 instead of the first electrical port 162 by the first reconfiguration switch 150a, while the second electrode 110b may be coupled to an electrical terminal different from the second electrical port 164 by the second reconfiguration switch 150b. The second electrode 110b may be coupled to direct current or ground or floating connections, in a non-limiting embodiment. For example, the first electrode 110a may be coupled to the first electrical port 162 to which a voltage denoted as P1 may be applied, the reconfigurable electrode segment(s) 130 may be coupled to the second electrical port 164 to which a voltage denoted as P2 may be applied, while a ground voltage may be applied to the second electrode 110b to produce a second electrode pitch 320 or effective separation distance (denoted as $\lambda_2$) of the first electrode 110a in the second operation mode, as illustrated in FIG. 3B. Accordingly, the first electrode 110a may be operable to have the second effective separation distance or electrode pitch in the second operation mode of the first reconfiguration switch 150a.

As illustrated in FIG. 3B, the second electrode pitch 320 (e.g., of the first electrode 110a) is increased in the second configuration state relative to the first electrode pitch 310 in the first configuration state. Accordingly, the first electrode 110a, the second electrode 110b and the reconfigurable electrode segment(s) 130 may be operated to have the second effective separation distance in the second configuration state of the first reconfiguration switch 150a, which is different from the first effective separation distance. In various non-limiting embodiments, the second effective separation distance may be greater than the first effective separation distance. For example, the reconfigurable electrode segment(s) 130 effectively decrease the electrode pitch between the electrode fingers 112a of the first electrode 110a in the first configuration state in the case the reconfigurable electrode segment(s) 130 are electrically connected to the same electrical port as the first electrode 110a. In a non-limiting embodiment, the value $\lambda_1$ of the first effective separation distance 310 may be equal to $\lambda_2/2$, while the first resonant frequency excited by the MEMS device may be twice the value of the second resonant frequency. For example, a smaller electrode pitch provides a higher resonant frequency. The MEMS device may be operated as a frequency doubler/divider by switching between the first operation mode and the second operation mode of the first reconfiguration switch 150a, in a non-limiting embodiment.

Table 1 shows exemplary values of voltages applied to the electrodes of a MEMS device in the first configuration state and the second configuration state of the reconfiguration switch as follows:

TABLE 1

| Electrode | First configuration state | Second configuration state |
|---|---|---|
| First electrode 110a | +1 V RF P1 | +1 V RF P1 |
| Reconfigurable electrode segment(s) 130 | +1 V RF P1 | 0 V RF P2 |
| Second electrode 110b | 0 V RF P2 | 0.0 V (GND) / 0.5 V (P1 + P2)/2 Floating |

Table 2 shows exemplary values of the effective separation distances of the electrodes and resonant frequencies $f_1$ and $f_2$ generated by the MEMS device when the reconfiguration switch is in the first configuration state and the second configuration state as follows:

TABLE 2

| | First operation mode | Second operation mode |
|---|---|---|
| V(m/s) - e.g., AlN | 8,600 | 8,600 |
| $f_1$ (n3 5G NR) | 1.8 GHz | — |
| $f_2$ (n8 5G NR) | — | 0.9 GHz |
| $\lambda_1$ (m) | 4.8 um | — |
| $\lambda_2$ (m) | — | 9.6 um |

In various non-limiting embodiments, the reconfiguration layer 140 may be a first reconfiguration layer 140a, the reconfigurable electrode segment(s) 130 includes a plurality of first reconfigurable electrode segments 130a and the MEMS device may further include a second reconfiguration layer 140b, as illustrated in FIGS. 1B-1C. The second reconfiguration layer 140b may be arranged over the second surface of the active layer (not shown in FIGS. 1B-1C). In various non-limiting embodiments, the MEMS device may further include a plurality of second reconfigurable electrode segments 130*b* arranged over the first surface of the active layer. The plurality of second reconfigurable electrode segments 130*b* and the second reconfiguration layer 140*b* may overlap. Via contacts 145 disposed in the active layer may be configured to couple the plurality of second reconfigurable electrode segments 130*b* and the second reconfiguration layer 140*b*. The second reconfiguration layer 140*b* may be coupled to the second reconfiguration switch 150*b*. As illustrated in FIGS. 1B-1C, the plurality of first reconfigurable electrode segments 130*a* may be coupled to the first reconfiguration switch 150*a* by the first reconfiguration layer 130*a*, while the plurality of second reconfigurable electrode segments 130*b* may be coupled to the second reconfiguration switch 150*b* by the second reconfiguration layer 140*b*.

In various non-limiting embodiments, the plurality of first reconfigurable electrode segments 130*a* may be arranged in alternating sequence with the first electrode fingers 112*a* of the first electrode 110*a*, while the plurality of second reconfigurable electrode segments 130*b* may be arranged in alternating sequence with the second electrode fingers 112*b* of the second electrode 110*b*. The first electrode 110*a* may be coupled to the first electrical port 162 while the second electrode 110*b* may be coupled to the second electrical port 164, as illustrated in FIGS. 1B-1C. For example, the second electrode 110*b* may be coupled to the second electrical port 164 without using (or being coupled to) the reconfiguration switch 150. For example, the second electrode 110*b* may be coupled to the second electrical port 164 by conductive paths.

The first electrode 110*a*, the second electrode 110*b*, the plurality of first reconfigurable electrode segments 130*a*, and the plurality of second reconfigurable electrode segments 130*b* may be patterned to have an initial or predefined separation distance. For example, each reconfigurable electrode segment 130 may be separated from an adjacent electrode finger 112 by a predefined separation distance. FIG. 1B and FIG. 1C illustrate embodiments of the MEMS device having the first electrode 110*a*, the second electrode 110*b*, the plurality of first reconfigurable electrode segments 130*a*, and the plurality of second reconfigurable electrode segments 130*b* patterned with different configuration or initial separation distance depending on the combination of frequencies desired in a MEMS device. For example, referring to FIG. 1B, two first reconfigurable electrode segments 130*a* may be arranged between two first electrode fingers 112*a* of the first electrode 110*a*, and two second reconfigurable electrode segments 130*b* may be arranged between two second electrode fingers 112*b* of the second electrode 110*b*. Additionally, one first reconfigurable electrode segment 130*a* and one second reconfigurable electrode segment 130*b* may be arranged between each immediate neighboring first electrode finger 112*a* of the first electrode 110*a* and second electrode finger 112*b* of the second electrode 110*b*. Referring to FIG. 1C, one first reconfigurable electrode segment 130*a* may be arranged between two first electrode fingers 112*a* of the first electrode 110*a*, and one second reconfigurable electrode segment 130*b* may be arranged between two second electrode fingers 112*b* of the second electrode 110*b*. Additionally, one of a first reconfigurable electrode segment 130*a* or second reconfigurable electrode segment 130*b* may be arranged between each immediate neighboring first electrode finger 112*a* of the first electrode 110*a* and second electrode finger 112*b* of the second electrode 110*b*.

The operation of the plurality of first reconfigurable electrode segments 130*a* and the plurality of second reconfigurable electrode segments 130*b* may be reconfigured by the first reconfiguration switch 150*a* and the second reconfiguration switch 150*b*, which further reconfigures an electrode pitch or effective separation distance (of the first electrode 110*a* and/or the first electrode 110*b*). The MEMS device may be configured to generate different resonant frequencies by reconfiguring the electrical connections to the plurality of first reconfigurable electrode segments 130*a* and the plurality of second reconfigurable electrode segments 130*b* using the first reconfiguration switch 150*a* and the second reconfiguration switch 150*b*.

The plurality of first reconfigurable electrode segments 130*a* may be coupled to the first electrical port 162 by the first reconfiguration switch 150*a* in the first configuration state (or first operation mode or state "A"), while the plurality of second reconfigurable electrode segments 130*b* may be coupled to the second electrical port 164 by the second reconfiguration switch 150*b* in the first configuration state to produce a first electrode pitch or effective separation distance. The plurality of first reconfigurable electrode segments 130*a* and the plurality of second reconfigurable electrode segments 130*b* may be coupled to electrical terminals (e.g., applied with direct current, ground voltage, floating ground) different from the first electrical port 162 and the second electrical port 164 by the first reconfiguration switch 150*a* and the second reconfiguration switch 150*b* in the second configuration state (or second operation mode or state "B") to produce a second electrode pitch or effective separation distance different from the first electrode pitch or effective separation distance.

FIGS. 4A-4B illustrate the electrode pitch or effective separation distance in the first configuration state and the second configuration state of the reconfiguration switch 150 respectively. For example, the electrode pitch may be, with respect to a MEMS device having the first electrode 110*a*, the second electrode 110*b*, the plurality of first reconfigurable electrode segments 130*a*, and the plurality of second reconfigurable electrode segments 130*b*, with a predefined separation distance or configuration as illustrated in FIG. 1B. The first electrode 110*a*, the second electrode 110*b*, the plurality of first reconfigurable electrode segments 130*a*, and the plurality of second reconfigurable electrode segments 130*b* may be operable to have the first electrode pitch 410 (denoted as $\lambda_1$) in the first configuration state, and may be operable to have the second electrode pitch 420 (denoted as $\lambda_2$) in the second configuration state of the reconfiguration switch 150 (e.g., the first reconfiguration switch 150*a* and the second reconfiguration switch 150*b*). As illustrated in FIG. 4B, the second electrode pitch 420 (e.g., of the first electrode 110*a* and/or the second electrode 110*b*) is increased in the second configuration state relative to the first electrode pitch 410 in the first configuration state. Accordingly, the first electrode 110*a*, the second electrode 110*b*, the plurality of first reconfigurable electrode segments 130*a*, and the plurality of second reconfigurable electrode segments 130*b* may be operated to have the second electrode pitch in the second configuration state of the first reconfiguration switch 150*a* and the second reconfiguration switch 150*b*, which is different from the first effective electrode pitch. The second electrode pitch 420 may be greater than the first electrode pitch 410.

For example, the plurality of first reconfigurable electrode segments 130*a* and the plurality of second reconfigurable electrode segments 130*b* effectively decrease the electrode pitch between the first electrode fingers 112*a* of the first electrode 110*a*, and the electrode pitch between the second electrode fingers 112*b* of the second electrode 110*b* in the first configuration state in the case the plurality of first reconfigurable electrode segments 130*a* are electrically connected to the same electrical port as the first electrode 110a and the plurality of second reconfigurable electrode segments 130b are electrically connected to the same electrical port as the second electrode 110b. For example, the value $\lambda_1$ of the first effective separation distance 410 of the plurality of electrode segments 110 may be equal to $\lambda_2/3$, while the first resonant frequency of the MEMS device may be triple the value of the second resonant frequency. The MEMS device may be operated as a frequency tripler/divider by three by switching between the first operation mode and the second operation mode of the first reconfiguration switch 150a and the second reconfiguration switch 150b, in a non-limiting embodiment.

Figure 5A:
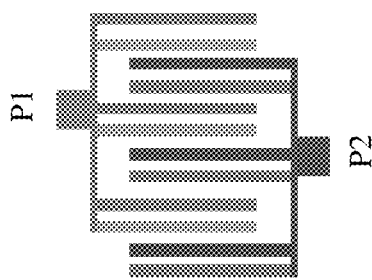
FIGS. 5A-5B illustrate yet another embodiment a first effective separation distance and a second effective separation distance in the first operation mode and the second operation mode, respectively.
Figure 5B:
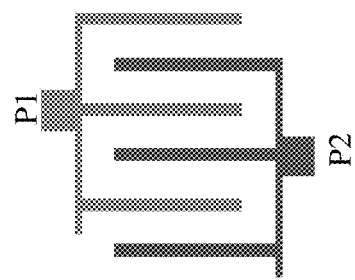

FIGS. 5A-5B illustrate the electrode pitch or effective separation distance in the first configuration state and the second configuration state of the reconfiguration switch 150 respectively. For example, the electrode pitch may be with respect to a MEMS device having the first electrode 110a, the second electrode 110b, the plurality of first reconfigurable electrode segments 130a, and the plurality of second reconfigurable electrode segments 130b with a predefined separation distance or configuration as illustrated in FIG. 1C. Similarly, the first electrode 110a, the second electrode 110b, the plurality of first reconfigurable electrode segments 130a, and the plurality of second reconfigurable electrode segments 130b may be operable to have a first electrode pitch in the first configuration state, and a second electrode pitch in the second configuration state of the first reconfiguration switch 150a and the second reconfiguration switch 150b. The second electrode pitch may be different from the first electrode pitch. For example, the second electrode pitch may be greater than first electrode pitch. The MEMS device may be configured with a fundamental-to-harmonic operation by switching between the first operation mode and the second operation mode of the reconfiguration switch, in a non-limiting example.

Accordingly, the reconfiguration switch 150 may be used to change the electrode pitch or effective separation distance of the electrode fingers. In a non-limiting embodiment, the reconfiguration switch 150 (e.g., the first reconfiguration switch 150a and/or the second reconfiguration switch 150b enables the MEMS device to generate two different resonant frequencies by switching between the electrode pitch using the reconfiguration switch 150. In a non-limiting embodiment, at least one resonant region may be connected to a single switch.

Figure 6A:
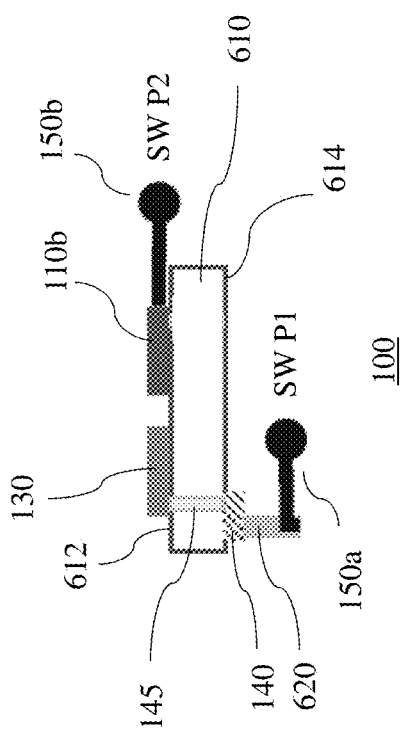
FIGS. 6A-6B show simplified cross-sectional views of embodiments of a device.
Figure 6B:
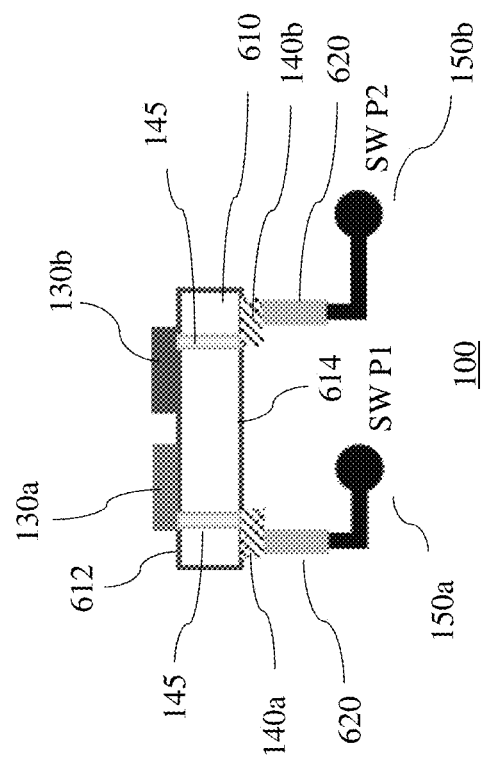

FIGS. 6A-6B show simplified cross-sectional views of embodiments of the device 100. The device 100 may be, or may include, a MEMS device. The MEMS device as illustrated in FIG. 6A may be similar to that described in FIG. 1A, while the MEMS device as illustrated in FIG. 6B may be similar to that described in FIGS. 1B-1C.

As illustrated, the device 100 may include an active layer 610. The active layer may include a first surface 612 and a second surface 614. The first surface 612 and the second surface 614 may be opposing surfaces. For example, the first surface 612 may be a top surface, while the second surface 614 may be a bottom surface of the active layer. Alternatively, the first surface 612 may be a bottom surface, while the second surface 614 may be a top surface of the active layer. The active layer 610 may be an acoustic layer. In various non-limiting embodiments, the active layer 610 may be, or may include, one or more piezoelectric layers. The first electrode 110a (not shown) and the second electrode 110b may be arranged over the first surface 612 of the active layer, as illustrated in FIG. 6A. Additionally, the reconfigurable electrode segment(s) 130 may be arranged over the first surface 612 of the active layer.

Referring to FIG. 6A, a reconfiguration layer 140 may be arranged over the second surface 614 of the active layer. The reconfigurable electrode segment(s) 130 may overlap the reconfiguration layer 140. As illustrated, the reconfigurable electrode segment(s) 130 may overlap the reconfiguration layer 140 in a horizontal plane, in a non-limiting embodiment. Said differently, at least one reconfigurable electrode segment and at least one reconfiguration layer overlaps in the horizontal plane. Other orientations for the reconfigurable electrode segment(s) 130 relative to the reconfiguration layer 140 may also be used. For example, in other non-limiting embodiments, the reconfigurable electrode segment(s) 130 may overlap the reconfiguration layer 140 in a vertical plane. One or more via contacts 145 may be disposed through the active layer from the first surface 612 to the second surface 614 of the active layer. The one or more via contacts 145 may extend through a depth of the active layer 610 to contact the reconfigurable electrode segment(s) 130 and the reconfiguration layer 140 arranged on opposing surfaces of the active layer 610. The via contact(s) 145 may be configured to couple the reconfigurable electrode segment(s) 130 and the reconfiguration layer 140.

The reconfiguration layer 140 may be coupled to the first reconfiguration switch 150a. In a non-limiting embodiment, the reconfiguration layer 140 may be coupled to the first reconfiguration switch 150a by electrical contacts 620. As illustrated, the second electrode 110b may be coupled to the second reconfiguration switch 150b. The second electrode 110b and the second reconfiguration switch 150b may be in the same or different topological level. The first reconfiguration switch 150a and the second reconfiguration switch 150b may be operated or configured independently. Both the first reconfiguration switch 150a and the second reconfiguration switch 150b may be in the same configuration state (e.g., first configuration state A or second configuration state B). The operation of the reconfigurable electrode segment(s) 130 and the second electrode 110b may be reconfigured by the first reconfiguration switch 150a and the second reconfiguration switch 150b to reconfigure an effective separation distance of the first electrode 110a.

Referring to FIG. 6B, a first reconfiguration layer 140a and a second reconfiguration layer 140b may be arranged over the second surface 614 of the active layer 610. The first reconfiguration layer 140a and the second reconfiguration layer 140b may overlap a resonant region of the MEMS device. A plurality of first reconfigurable electrode segments 130a may overlap the first reconfiguration layer 140a and a plurality of second reconfigurable electrode segments 130b may overlap the second reconfiguration layer 140b. As illustrated, the plurality of first reconfigurable electrode segments 130a and the plurality of second reconfigurable electrode segments 130b may overlap the first reconfiguration layer 140a and the second reconfiguration layer 140b, respectively, in a horizontal plane, in a non-limiting embodiment. Other orientations for the plurality of first reconfigurable electrode segments 130a and the plurality of second reconfigurable electrode segments 130b relative to the first reconfiguration layer 140a and the second reconfiguration layer 140b may also be used. For example, in other non-limiting embodiments, the plurality of first reconfigurable electrode segments 130a and the plurality of second reconfigurable electrode segments 130b may overlap the first reconfiguration layer 140a and the second reconfiguration layer 140b, respectively, in a vertical plane. Via contacts 145 may be disposed through the active layer from the first surface 612 to the second surface 614 of the active layer. The via contacts 145 may extend through a depth of the active layer 610 to contact the plurality of first reconfigurable electrode segments 130a and the first reconfiguration layer 140a arranged on opposing surfaces of the active layer 610, and to contact the plurality of second reconfigurable electrode segments 130b and the second reconfiguration layer 140b.

The first reconfiguration layer 140a may be coupled to the first reconfiguration switch 150a and the second reconfiguration layer 140b may be coupled to the second reconfiguration switch 150b. For example, the first reconfiguration layer 140a and the second reconfiguration layer 140b may be coupled to the first reconfiguration switch 150a and the second reconfiguration switch 150b respectively by electrical contacts 620 (e.g., interconnection vias and/or metal lines).

In various non-limiting embodiments, the first reconfiguration switch 150a and the second reconfiguration switch 150b may be formed by CMOS processing. The reconfiguration switch 150 may be integrated with a CMOS wafer, in a non-limiting embodiment. The MEMS device, for example, may be arranged over a substrate such as, a silicon wafer, a silicon-on-insulator wafer, a wafer including an integrated circuit, or a CMOS wafer. The MEMS device and the reconfiguration switch (e.g., first reconfiguration switch 150a and/or the second reconfiguration switch 150b) may be arranged in the same wafer, or in different wafers.

Figure 7:
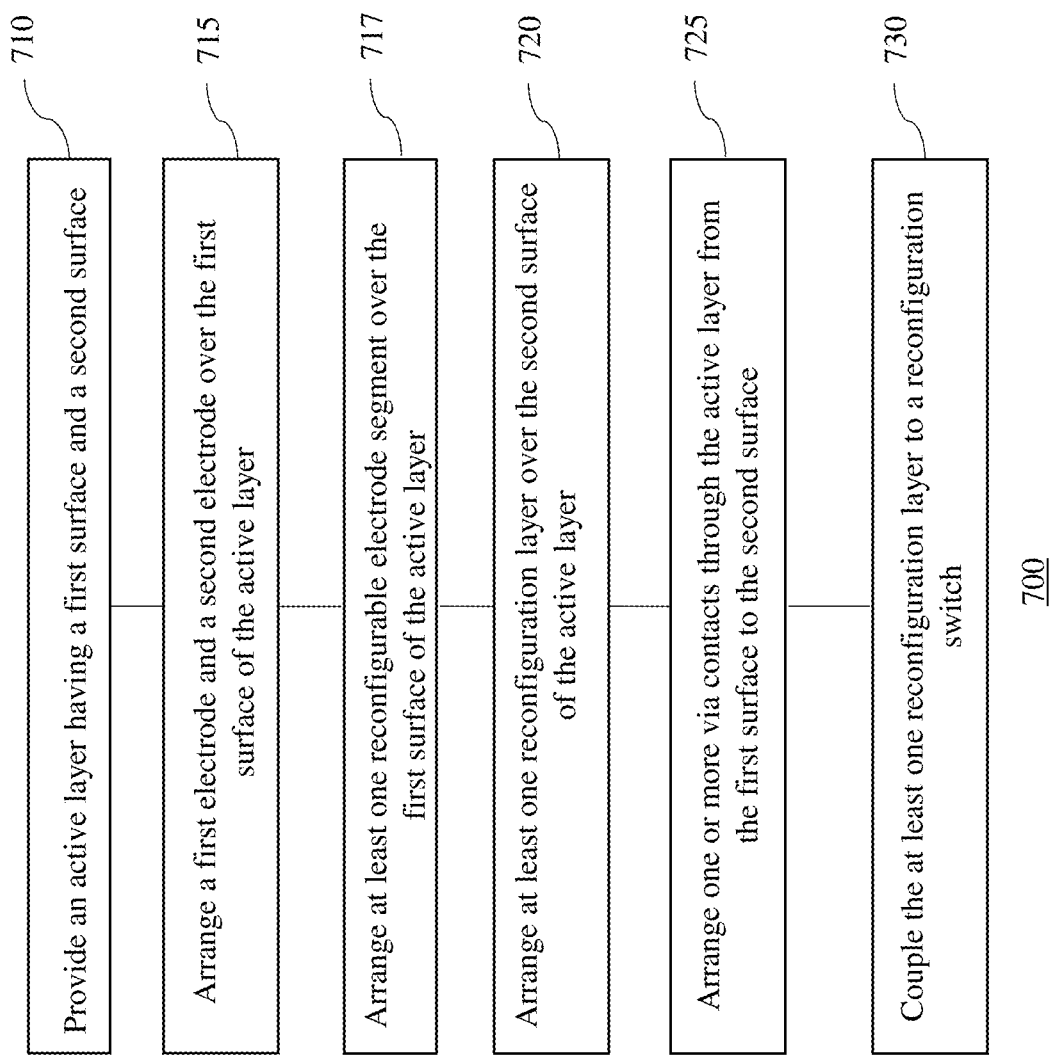
FIG. 7 shows a block diagram of an exemplary process for forming a device.

FIG. 7 shows a block diagram of an exemplary process 700 for forming a device. The device, for example, is similar to that described in FIGS. 1A-1C. The device may be, or may include, a MEMS device. At 710, an active layer having a first surface and a second surface may be provided. The active layer may include one or more piezoelectric layers. In a non-limiting example, the active layer may include or may be formed from materials as described above.

At 715, a first electrode and a second electrode may be arranged over the first surface of the active layer.

At 717, at least one reconfigurable electrode segment may be arranged over the first surface of the active layer. The at least one reconfigurable electrode segment may be arranged between the first electrode and the second electrode. The first electrode, the second electrode and the reconfigurable electrode segment(s) may be formed and patterned as described above with respect to the devices.

At 720, at least one reconfiguration layer may be arranged over the second surface of the active layer.

At 725, one or more via contacts may be arranged through the active layer from the first surface to the second surface.

At 730, the at least one reconfiguration layer may be coupled to a reconfiguration switch for reconfiguring electrical connections to the reconfigurable electrode segment(s).

Figure 8:
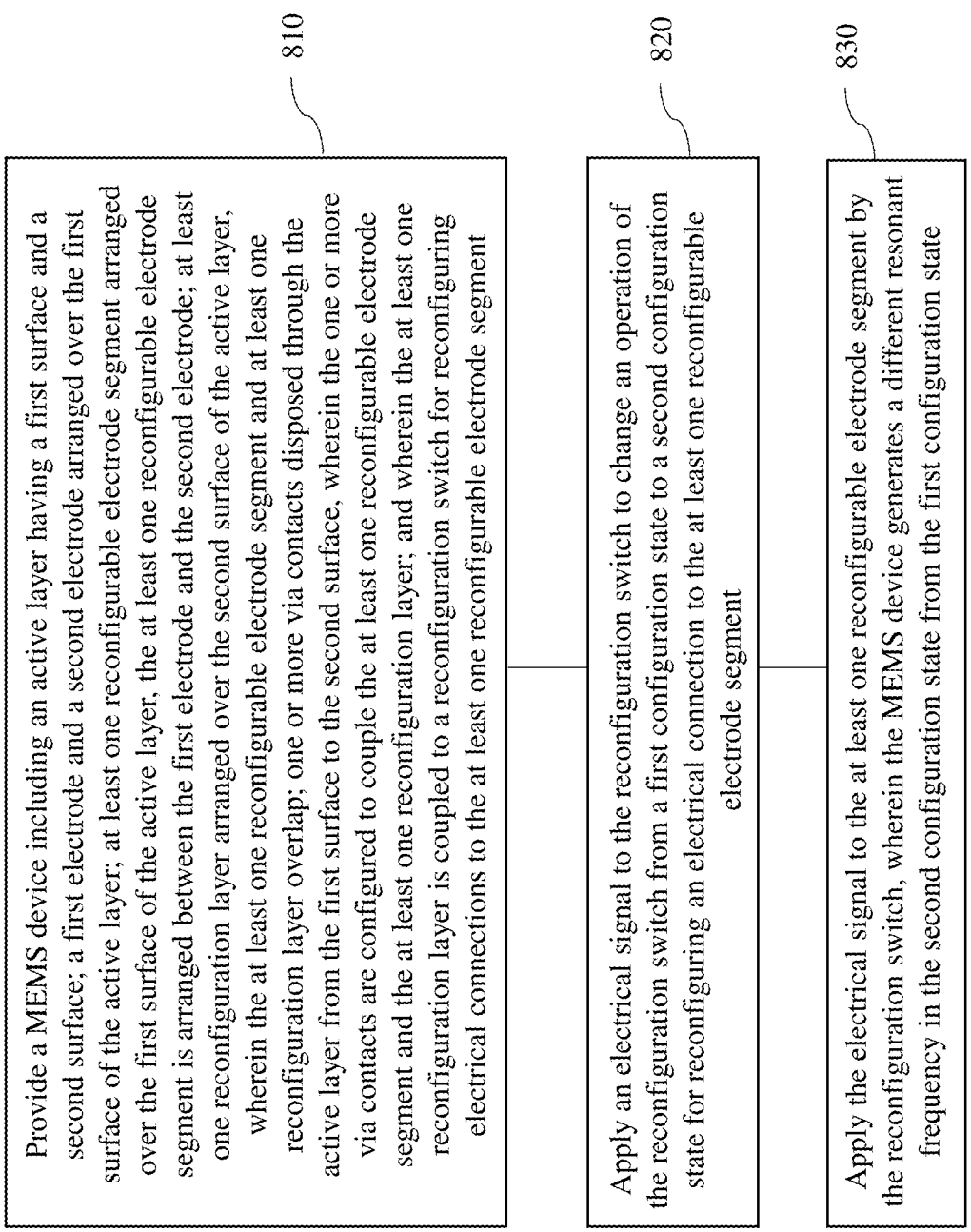
FIG. 8 shows a block diagram of an exemplary method for reconfiguring a resonant frequency of a device.

FIG. 8 shows a block diagram of an exemplary method 800 for reconfiguring a resonant frequency of a device. The device, for example, may be similar to that described in FIGS. 1A-1C. The device may be, or may include, a MEMS device. At 810, the MEMS device may be provided. At 820, an electrical signal may be applied to the reconfiguration switch to change an operation of the reconfiguration switch from a first configuration state to a second configuration state for reconfiguring an electrical connection to the at least one reconfigurable electrode segment. At 830, the electrical signal may be applied or reconfigured to the at least one reconfigurable electrode segment by the reconfiguration switch. The MEMS device generates a different resonant frequency in the second configuration state from the first configuration state.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A microelectromechanical system (MEMS) device comprising:
   an active layer having a first surface and a second surface;
   a first electrode and a second electrode arranged over the first surface of the active layer;
   at least one reconfigurable electrode segment arranged over the first surface of the active layer, the at least one reconfigurable electrode segment is arranged between the first electrode and the second electrode;
   at least one reconfiguration layer arranged over the second surface of the active layer, wherein the at least one reconfigurable electrode segment and the at least one reconfiguration layer overlaps;
   one or more via contacts disposed through the active layer from the first surface to the second surface, wherein the one or more via contacts are configured to couple the at least one reconfigurable electrode segment and the at least one reconfiguration layer; and
   wherein the at least one reconfiguration layer is coupled to a reconfiguration switch for reconfiguring electrical connections to the at least one reconfigurable electrode segment, wherein the MEMS device is configured to generate different resonant frequencies by reconfiguring the electrical connections to the at least one reconfigurable electrode segment using the reconfiguration switch.

2. The MEMS device of claim 1, wherein the active layer comprises one or more piezoelectric layers.

3. The MEMS device of claim 2, wherein the one or more via contacts extend through at least a portion of the one or more piezoelectric layers.

4. The MEMS device of claim 1, wherein the first electrode and the second electrode each comprises a plurality of interconnected electrode fingers, and wherein:
   the first electrode, the second electrode and the at least one reconfigurable electrode segment are configured to produce a first electrode pitch in a first configuration state of the reconfiguration switch to generate a first resonant frequency, and
   the first electrode, the second electrode and the at least one reconfigurable electrode segment are configured to produce a second electrode pitch different from the first electrode pitch in a second configuration state of the reconfiguration switch to generate a second resonant frequency different from the first resonant frequency.

5. The MEMS device of claim 1, wherein the first electrode is coupled to a first electrical port, and wherein:
   the at least one reconfigurable electrode segment is further coupled to the first electrical port by the reconfiguration switch in a first configuration state, the first electrode, the second electrode and the at least one reconfigurable electrode segment are configured to produce a first electrode pitch in the first configuration state, and the at least one reconfigurable electrode segment is further coupled to an electrical terminal different from the first electrical port by the reconfiguration switch in a second configuration state, the first electrode, the second electrode and the at least one reconfigurable electrode segment are configured to produce a second electrode pitch in the second configuration state, wherein the second electrode pitch is greater than the first electrode pitch.

6. The MEMS device of claim 5, wherein the reconfiguration switch is a first reconfiguration switch, and the second electrode is coupled to a second reconfiguration switch, wherein:
the second electrode is coupled to a second electrical port by the second reconfiguration switch in the first configuration state, and
the second electrode is coupled to an electrical terminal different from the second electrical port by the second reconfiguration switch in the second configuration state while the at least one reconfigurable electrode segment is further coupled to the second electrical port by the reconfiguration switch in the second configuration state.

7. The MEMS device of claim 5, wherein the at least one reconfiguration layer is a first reconfiguration layer, the at least one reconfigurable electrode segment comprises a plurality of first reconfigurable electrode segments, and the reconfiguration switch is a first reconfiguration switch, the MEMS device further comprises:
a second reconfiguration layer arranged over the second surface of the active layer,
a plurality of second reconfigurable electrode segments arranged over the first surface of the active layer, the plurality of second reconfigurable electrode segments and the second reconfiguration layer overlap,
via contacts in the active layer configured to couple the plurality of second reconfigurable electrode segments and the second reconfiguration layer, and
wherein the second reconfiguration layer is coupled to a second reconfiguration switch, wherein the MEMS device is configured to generate different resonant frequencies by further reconfiguring the electrical connections to the plurality of second reconfigurable electrode segments using the second reconfiguration switch.

8. The MEMS device of claim 1, wherein the first electrode, the second electrode and the at least one reconfigurable electrode segment are substantially co-planar over the first surface of the active layer.

9. The MEMS device of claim 1, wherein the at least one reconfigurable electrode segment comprises a plurality of first reconfigurable electrode segments, and the first electrode comprises a plurality of interconnected first electrode fingers, the plurality of first reconfigurable electrode segments are arranged in alternating sequence with the plurality of interconnected first electrode fingers over the first surface of the active layer.

10. The MEMS device of claim 9, wherein the reconfiguration switch comprises a single switch.

11. The MEMS device of claim 1, wherein the reconfiguration switch comprises a single pole two throw switch.

12. The MEMS device of claim 1, wherein the at least one reconfigurable electrode segment and the at least one reconfiguration layer overlaps in a horizontal plane.

13. A method for forming a microelectromechanical system (MEMS) device, comprising:
providing an active layer having a first surface and a second surface;
arranging a first electrode and a second electrode over the first surface of the active layer;
arranging at least one reconfigurable electrode segment over the first surface of the active layer, the at least one reconfigurable electrode segment is arranged between the first electrode and the second electrode;
arranging at least one reconfiguration layer over the second surface of the active layer, wherein the at least one reconfigurable electrode segment and the at least one reconfiguration layer overlaps;
arranging one or more via contacts through the active layer from the first surface to the second surface, wherein the one or more via contacts are configured to couple the at least one reconfigurable electrode segment and the at least one reconfiguration layer; and
coupling the at least one reconfiguration layer to a reconfiguration switch for reconfiguring electrical connections to the at least one reconfigurable electrode segment, wherein the MEMS device is configured to generate different resonant frequencies by reconfiguring the electrical connections to the at least one reconfigurable electrode segment using the reconfiguration switch.

14. The method of claim 13, wherein the active layer comprises one or more piezoelectric layers.

15. The method of claim 14, wherein arranging the one or more via contacts comprises forming one or more via contacts extending through at least a portion of the one or more piezoelectric layers.

16. The method of claim 13, wherein the first electrode and the second electrode each comprises a plurality of interconnected electrode fingers, and wherein arranging the first electrode, the second electrode and the at least one reconfigurable electrode segment over the first surface of the active layer comprises:
depositing an electrode material over the first surface of the active layer, and
patterning the electrode material to form the first electrode, the second electrode and the at least one reconfigurable electrode segment, wherein the first electrode, the second electrode and the at least one reconfigurable electrode segment are configured to produce a first electrode pitch in a first configuration state of the reconfiguration switch, and configured to produce a second electrode pitch different from the first electrode pitch in a second configuration state of the reconfiguration switch.

17. The method of claim 13, further comprising coupling the first electrode to a first electrical port, and wherein:
the at least one reconfigurable electrode segment is coupleable to the first electrical port by the reconfiguration switch in a first configuration state, the first electrode, the second electrode and the at least one reconfigurable electrode segment are configured to produce a first electrode pitch in the first configuration state, and
the at least one reconfigurable electrode segment is coupleable to an electrical terminal different from the first electrical port by the reconfiguration switch in a second configuration state, the first electrode, the second electrode and the at least one reconfigurable electrode segment are configured to produce a second electrode pitch in the second configuration state, wherein the second electrode pitch is greater than the first electrode pitch.

18. The method of claim 17, wherein the reconfiguration switch is a first reconfiguration switch, and further comprising coupling the second electrode to a second reconfiguration switch, wherein:
the second electrode is coupleable to a second electrical port by the second reconfiguration switch in the first configuration state, and
the second electrode is coupleable to an electrical terminal different from the second electrical port by the second reconfiguration switch in the second configuration state while the at least one reconfigurable electrode segment is coupleable to the second electrical port by the first reconfiguration switch in the second configuration state.

19. The method of claim 17, wherein the at least one reconfiguration layer is a first reconfiguration layer, and the at least one reconfigurable electrode segment comprises a plurality of first reconfigurable electrode segments, the reconfiguration switch is a first reconfiguration switch, the method further comprising:
arranging a second reconfiguration layer over the second surface of the active layer,
arranging a plurality of second reconfigurable electrode segments over the first surface of the active layer, the plurality of second reconfigurable electrode segments and the second reconfiguration layer overlap,
arranging via contacts in the active layer for coupling the plurality of second reconfigurable electrode segments and the second reconfiguration layer, and
coupling the second reconfiguration layer to a second reconfiguration switch, wherein the MEMS device is configured to generate different resonant frequencies by further reconfiguring the electrical connections to the plurality of second reconfigurable electrode segments using the second reconfiguration switch.

20. A method for reconfiguring a resonant frequency of a microelectromechanical system (MEMS) device, comprising:
providing a MEMS device comprising:
an active layer having a first surface and a second surface;
a first electrode and a second electrode arranged over the first surface of the active layer;
at least one reconfigurable electrode segment arranged over the first surface of the active layer, the at least one reconfigurable electrode segment is arranged between the first electrode and the second electrode;
at least one reconfiguration layer arranged over the second surface of the active layer, wherein the at least one reconfigurable electrode segment and the at least one reconfiguration layer overlaps;
one or more via contacts disposed through the active layer from the first surface to the second surface, wherein the one or more via contacts are configured to couple the at least one reconfigurable electrode segment and the at least one reconfiguration layer; and
wherein the at least one reconfiguration layer is coupled to a reconfiguration switch for reconfiguring electrical connections to the at least one reconfigurable electrode segment;
applying an electrical signal to the reconfiguration switch to change an operation of the reconfiguration switch from a first configuration state to a second configuration state for reconfiguring an electrical connection to the at least one reconfigurable electrode segment; and
applying the electrical signal to the first reconfigurable electrode segment by the reconfiguration switch, wherein the MEMS device generates a different resonant frequency in the second configuration state from the first configuration state.

* * * * *